United States Patent
Akimoto et al.

(10) Patent No.: US 10,403,763 B2
(45) Date of Patent: *Sep. 3, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Kengo Akimoto, Atsugi (JP); Junichiro Sakata, Atsugi (JP); Takuya Hirohashi, Atsugi (JP); Masahiro Takahashi, Atsugi (JP); Hideyuki Kishida, Atsugi (JP); Akiharu Miyanaga, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/891,583

(22) Filed: Feb. 8, 2018

(65) Prior Publication Data

US 2018/0166581 A1 Jun. 14, 2018

Related U.S. Application Data

(63) Continuation of application No. 14/972,964, filed on Dec. 17, 2015, now Pat. No. 9,893,200, which is a
(Continued)

(30) Foreign Application Priority Data

Nov. 20, 2008 (JP) .................................. 2008-296901

(51) Int. Cl.
*H01L 29/786* (2006.01)
*H01L 29/04* (2006.01)
(Continued)

(52) U.S. Cl.
CPC .... *H01L 29/7869* (2013.01); *H01L 21/02565* (2013.01); *H01L 21/28079* (2013.01);
(Continued)

(58) Field of Classification Search
CPC ........... H01L 29/7869; H01L 29/78693; H01L 21/02565; H01L 29/66969; H01L 29/04
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    001610080 A    4/2005
CN    001941299 A    4/2007
(Continued)

OTHER PUBLICATIONS

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.
(Continued)

*Primary Examiner* — Stephen W Smoot
*Assistant Examiner* — Sun Mi Kim King
(74) *Attorney, Agent, or Firm* — Robinson Intellectual Property Law Office; Eric J. Robinson

(57) ABSTRACT

It is an object to provide an oxide semiconductor which is suitable for use in a semiconductor device. Alternatively, it is another object to provide a semiconductor device using the oxide semiconductor. Provided is a semiconductor device including an In—Ga—Zn—O based oxide semiconductor layer in a channel formation region of a transistor. In the semiconductor device, the In—Ga—Zn—O based oxide
(Continued)

semiconductor layer has a structure in which crystal grains represented by $InGaO_3(ZnO)_m$ (m=1) are included in an amorphous structure represented by $InGaO_3(ZnO)_m$ (m>0).

11 Claims, 16 Drawing Sheets

Related U.S. Application Data continuation of application No. 14/140,044, filed on Dec. 24, 2013, now Pat. No. 9,252,288, which is a continuation of application No. 13/677,504, filed on Nov. 15, 2012, now Pat. No. 8,643,011, which is a continuation of application No. 12/618,944, filed on Nov. 16, 2009, now Pat. No. 8,329,506.

(51) Int. Cl.
    *H01L 29/66*     (2006.01)
    *H01L 21/02*     (2006.01)
    *H01L 21/28*     (2006.01)

(52) U.S. Cl.
    CPC ........ *H01L 21/28158* (2013.01); *H01L 29/04* (2013.01); *H01L 29/66742* (2013.01); *H01L 29/66969* (2013.01); *H01L 29/78693* (2013.01)

(56) References Cited

U.S. PATENT DOCUMENTS

| | | |
|---|---|---|
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishil et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,683,370 B2 | 3/2010 | Kugimiya et al. |
| 7,696,513 B2 | 4/2010 | Hayashi et al. |
| 7,732,819 B2 | 6/2010 | Akimoto et al. |
| 7,767,505 B2 | 8/2010 | Son et al. |
| 7,804,091 B2 | 9/2010 | Takechi et al. |
| 7,829,444 B2 | 11/2010 | Yabuta et al. |
| 7,851,792 B2 | 12/2010 | Aiba et al. |
| 7,855,379 B2 | 12/2010 | Hayashi et al. |
| 7,884,360 B2 | 2/2011 | Takechi et al. |
| 7,910,490 B2 | 3/2011 | Akimoto et al. |
| 7,910,920 B2 | 3/2011 | Park et al. |
| 7,932,521 B2 | 4/2011 | Akimoto et al. |
| 7,968,884 B2 | 6/2011 | Yamazaki et al. |
| 8,013,331 B2 | 9/2011 | Wakita |
| 8,063,421 B2 | 11/2011 | Kang et al. |
| 8,088,652 B2 | 1/2012 | Hayashi et al. |
| 8,153,031 B2 | 4/2012 | Yano et al. |
| 8,154,017 B2 | 4/2012 | Yabuta et al. |
| 8,232,552 B2 | 7/2012 | Yano et al. |
| 8,274,077 B2 | 9/2012 | Akimoto et al. |
| 8,319,218 B2 | 11/2012 | Yamazaki et al. |
| 8,415,198 B2 | 4/2013 | Itagaki et al. |
| 8,420,442 B2 | 4/2013 | Takechi et al. |
| 8,436,349 B2 | 5/2013 | Sano et al. |
| 8,466,463 B2 | 6/2013 | Akimoto et al. |
| 8,502,222 B2 | 8/2013 | Yabuta et al. |
| 8,614,442 B2 | 12/2013 | Park et al. |
| 8,643,011 B2* | 2/2014 | Akimoto ................ H01L 29/04 257/43 |
| 9,252,288 B2* | 2/2016 | Akimoto ................ H01L 29/04 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0090078 A1 | 4/2005 | Ishihara |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228898 A1 | 10/2006 | Wajda et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |

(56) References Cited

U.S. PATENT DOCUMENTS

| | | | |
|---|---|---|---|
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2008/0318367 | A1 | 12/2008 | Shimomura et al. |
| 2009/0008639 | A1 | 1/2009 | Akimoto et al. |
| 2009/0032096 | A1 | 2/2009 | Tanaka et al. |
| 2009/0065771 | A1 | 3/2009 | Iwasaki et al. |
| 2009/0068773 | A1 | 3/2009 | Lai et al. |
| 2009/0072233 | A1 | 3/2009 | Hayashi et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0179199 | A1 | 7/2009 | Sano et al. |
| 2009/0272970 | A1 | 11/2009 | Aiba et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2009/0325341 | A1 | 12/2009 | Itagaki et al. |
| 2010/0025678 | A1 | 2/2010 | Yamazaki et al. |
| 2010/0065844 | A1 | 3/2010 | Tokunaga |
| 2010/0072470 | A1 | 3/2010 | Yamazaki et al. |
| 2010/0084652 | A1* | 4/2010 | Yamazaki ............ H01L 27/1225 257/43 |
| 2010/0092800 | A1 | 4/2010 | Itagaki et al. |
| 2010/0109002 | A1 | 5/2010 | Itagaki et al. |
| 2010/0117999 | A1 | 5/2010 | Matsunaga et al. |
| 2010/0136743 | A1 | 6/2010 | Akimoto et al. |
| 2010/0140612 | A1 | 6/2010 | Omura et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0254004 | A1 | 10/2011 | Yamazaki et al. |
| 2013/0126344 | A1 | 5/2013 | Chau et al. |
| 2013/0277672 | A1 | 10/2013 | Sano et al. |
| 2015/0318405 | A1 | 11/2015 | Hayashi et al. |

FOREIGN PATENT DOCUMENTS

| | | |
|---|---|---|
| CN | 101057339 A | 10/2007 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2453480 A | 5/2012 |
| EP | 2453481 A | 5/2012 |
| EP | 2455975 A | 5/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 07-235219 A | 9/1995 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-129666 A | 5/2005 |
| JP | 2006-165529 A | 6/2006 |
| JP | 2007-073559 A | 3/2007 |
| JP | 2007-096055 A | 4/2007 |
| JP | 2007-115735 A | 5/2007 |
| JP | 2007-115902 A | 5/2007 |
| JP | 2007-123861 A | 5/2007 |
| JP | 2007-150158 A | 6/2007 |
| JP | 2007-158307 A | 6/2007 |
| JP | 2007-173489 A | 7/2007 |
| JP | 2007-250983 A | 9/2007 |
| JP | 2007-250984 A | 9/2007 |
| JP | 2007-311404 A | 11/2007 |
| JP | 2008-042088 A | 2/2008 |
| JP | 2008-053356 A | 3/2008 |
| JP | 2008-171989 A | 7/2008 |
| JP | 2008-205469 A | 9/2008 |
| JP | 2008-219008 A | 9/2008 |
| JP | 2008-235871 A | 10/2008 |
| JP | 2008-243928 A | 10/2008 |
| JP | 2008-276212 A | 11/2008 |
| JP | 2008-277326 A | 11/2008 |
| JP | 2007/148601 | 11/2009 |
| KR | 2008-0052428 A | 6/2008 |
| TW | 200717651 | 5/2007 |
| TW | 200822372 | 5/2008 |
| WO | WO-2004/114391 | 12/2004 |
| WO | WO-2005/088726 | 9/2005 |
| WO | WO-2006/051993 | 5/2006 |
| WO | WO-2006/107417 | 10/2006 |
| WO | WO-2007/055256 | 5/2007 |
| WO | WO-2007/119321 | 10/2007 |
| WO | WO-2007/119386 | 10/2007 |
| WO | WO-2007/148601 | 12/2007 |
| WO | WO-2008/023553 | 2/2008 |
| WO | WO-2008/105347 | 9/2008 |
| WO | WO-2008/126884 | 10/2008 |
| WO | WO-2008/133220 | 11/2008 |
| WO | WO-2008/139654 | 11/2008 |
| WO | WO-2008/149873 | 12/2008 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al "A Ferroelectric Transparent Thin-Film Transistor", Appl. Phys. Lett. (Applied Physics Letters) , Jun. 17, 1996, vol. 68, No. 25, pp. 3650-3642.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Kurokawa.Y et al., "UHF RFCPUs on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp, 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AMOLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. Lett. (Physical Review Letters), May 4, 1981, vol. 46, No. 18, pp. 1216-1219.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn-O TFTs", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn-O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Yabuta.H et al., "High-Mobility Thin-Film Transistor With Amorphous InGaZnO4 Channel Fabricated by Room Temperature RF-Magnetron Sputtering", Appl. Phys. Lett. (Applied Physics Letters), 2006, vol. 89, pp. 112123-1-112123-3.

Kim.D et al., "Thickness Dependence of Gate Dielectric and Active Semiconductor on InGaZnO4 TFT Fabricated on Plastic Substrates", Electrochemical and Solid-State Letters, 2008, vol. 11, No. 12, pp. H317-H319.

Chinese Office Action (Application No. 200910226491.0) dated May 27, 2013.

Taiwanese Office Action (Application No. 098138245) dated Dec. 3, 2014.

Chinese Office Action (Application No. 201410612094.6) dated Oct. 27, 2016.

\* cited by examiner

FIG. 2

| flow rate (sccm) | composition (atomic%) | | | | composition formula |
|---|---|---|---|---|---|
| Ar/O$_2$ | In | Ga | Zn | O | |
| 10/5 | 17.7 | 16.7 | 7 | 58.6 | InGa$_{0.94}$Zn$_{0.40}$O$_{3.31}$ |
| 40/0 | 17.6 | 16.7 | 7.2 | 58.6 | InGa$_{0.95}$Zn$_{0.41}$O$_{3.33}$ |

FIG. 3

| flow rate (sccm) | composition (atomic%) | | | | | composition formula |
|---|---|---|---|---|---|---|
| Ar/O$_2$ | In | Ga | Zn | O | Ar | |
| 10/5 | 16 | 14.7 | 7.2 | 61.7 | 0.4 | InGa$_{0.92}$Zn$_{0.45}$O$_{3.86}$ |
| 40/0 | 17 | 15.8 | 7.5 | 59.4 | 0.3 | InGa$_{0.93}$Zn$_{0.44}$O$_{3.49}$ |

FIG. 10

| Structure | Difference in energy (eV) |
|---|---|
| 1 (U1+L1) | 0 |
| 2 (U1+L4) | 0.25 |
| 3 (U1+L2) | 0.15 |
| 4 (U7+L7) | 0.22 |
| 5 (U7+L10) | 0.39 |
| 6 (U11+L11) | 0.77 |

FIG. 13

| Compound | $E_{VO}$ (eV) |
|---|---|
| $In_2O_3$ | 3.06 |
| ZnO | 3.75 |
| IGZO(Model 1) | 3.73 |
| IGZO(Model 2) | 3.98 |
| IGZO(Model 3) | 4.08 |
| $Ga_2O_3$ | 4.18 |

 Ga in the upper layer   Ga in the lower layer
 Zn in the upper layer   Zn in the lower layer

FIG. 15

| Distribution | The number of nearest neighbor atoms of the same kind | Energy (eV) |
|---|---|---|
| (a) | 0 | 0.77 |
| (b) | 2 | 0.25 |
| (c) | 1.5 | 0.15 |
| (d) | 1 | 0 |

SEMICONDUCTOR DEVICE AND METHOD FOR MANUFACTURING THE SAME

BACKGROUND OF THE INVENTION

1. Field of the Invention

The present invention relates to a semiconductor device using an oxide semiconductor and a method for manufacturing the semiconductor device.

2. Description of the Related Art

A field-effect transistor (also referred to as an FET) is the most widely-used semiconductor element at present. A variety of materials are used for field-effect transistors according to their uses. In particular, semiconductor materials including silicon are frequently used.

The field-effect transistor using silicon has characteristics satisfying the needs with respect to a variety of uses. For example, single crystal silicon is used for an integrated circuit or the like which needs to be operated at a high speed, whereby the need with respect to the integrated circuit is satisfied. Further, amorphous silicon is used for an object which needs a large area, such as a display device, whereby the need with respect to the object can be satisfied.

As described above, silicon is highly versatile and can be used for various purposes. However, in recent years, semiconductor materials tend to be expected to have higher performance as well as versatility. For example, in terms of improving performance of a large-area display device, in order to realize high-speed operation of a switching element, a semiconductor material which facilitates increase of the area of a display device and has higher performance than amorphous silicon is needed.

Under such conditions, a technique relating to a field-effect transistor using an oxide semiconductor has attracted attention. For example, in Patent Document 1, a transparent thin film field-effect transistor using a homologous compound $InMO_3(ZnO)_m$ (M is In, Fe, Ga, or Al, and m is an integer number of greater than or equal to 1 and less than 50) is disclosed.

In addition, in Patent Document 2, a field-effect transistor is disclosed in which an amorphous oxide semiconductor whose electron carrier concentration is less than $10^{18}/cm^3$ and which contains In, Ga, and Zn is used. Note that in Patent Document 2, the ratio of In:Ga:Zn equals to 1:1:m (m<6) in the amorphous oxide semiconductor.

Further, in Patent Document 3, a field-effect transistor is disclosed in which an amorphous oxide semiconductor including a microcrystal is used for an active layer.

REFERENCES

[Patent Document 1]
Japanese Published Patent Application No. 2004-103957
[Patent Document 2]
PCT International Publication No. 05/088726
[Patent Document 3]
Japanese Published Patent Application No. 2006-165529

SUMMARY OF THE INVENTION

In Patent Document 3, a disclosure is given in which a composition in a crystal state is $InGaO_3(ZnO)_m$ (m is an integer number of less than 6). Further, in Example 1 of Patent Document 3, a case of $InGaO_3(ZnO)_4$ is disclosed.

However, in the real condition, adequate characteristics have not been obtained even when such oxide semiconductors are used.

In view of the foregoing problems, it is an object to provide an oxide semiconductor which is suitable for use in a semiconductor device. Alternatively, it is another object to provide a semiconductor device using the oxide semiconductor.

In the invention to be disclosed, a semiconductor device is manufactured such that crystal grains represented by $InGaO_3(ZnO)_m$ (m=1) are included in an amorphous structure represented by $InGaO_3(ZnO)_m$ (m>0). Specifics are described below.

One embodiment of the invention to be disclosed is a semiconductor device including an In—Ga—Zn—O based oxide semiconductor layer used for a channel formation region of a transistor. In the semiconductor device, the In—Ga—Zn—O based oxide semiconductor layer has a structure in which crystal grains represented by $InGaO_3(ZnO)_m$ (m=1) are included in an amorphous structure represented by $InGaO_3(ZnO)_m$ (m>0).

In the above, a Zn content (atomic %) in the In—Ga—Zn—O based oxide semiconductor layer is preferably less than an In content (atomic %) and less than a Ga content (atomic %). Further, the oxide semiconductor layer is preferably formed by a sputtering method using a target in which a Zn content (atomic %) is less than or equal to an In content (atomic %) and less than or equal to a Ga content (atomic %). Further, in the above, it is preferable that only crystal grains each having a structure represented by $InGaO_3(ZnO)_m$ (m=1) be used. However, under the conditions where the proportion of the structure represented by $InGaO_3(ZnO)_m$ (m=1) in crystal grains is 80 vol % or more, given characteristics can be obtained.

Another embodiment of the invention to be disclosed is a method for manufacturing a semiconductor device including the steps of: forming an In—Ga—Zn—O based oxide semiconductor layer having an amorphous structure over a substrate by a sputtering method; and subjecting the oxide semiconductor layer to heat treatment to form an oxide semiconductor layer including crystal grains represented by $InGaO_3(ZnO)_m$ (m=1) in an amorphous structure represented by $InGaO_3(ZnO)_m$ (m>0). In the method for manufacturing a semiconductor device, the oxide semiconductor layer including crystal grains is used for a channel formation region of a transistor.

In the above, the In—Ga—Zn—O based oxide semiconductor layer having an amorphous structure is preferably formed such that a Zn content (atomic %) is less than an In content (atomic %) and less than a Ga content (atomic %). Further, the In—Ga—Zn—O based oxide semiconductor layer having an amorphous structure is preferably formed by a sputtering method using a target in which a Zn content (atomic %) is less than or equal to an In content (atomic %) and less than or equal to a Ga content (atomic %). Furthermore, the heat treatment is preferably performed at 350° C. or more.

Note that in this specification, a semiconductor device means any device which can function by utilizing semiconductor characteristics; and a display device, a semiconductor circuit, and an electronic device are all included in the semiconductor devices.

Crystal grains represented by $InGaO_3(ZnO)_m$ (m=1) are included in an amorphous structure represented by $InGaO_3(ZnO)_m$ (m>0), whereby the electrical characteristics of an oxide semiconductor can be improved. Further, by using the oxide semiconductor, an excellent semiconductor device can be provided.

BRIEF DESCRIPTION OF THE DRAWINGS

FIG. 2 is a table showing the results of analyzing the compositions of non-single-crystal semiconductor layers.

FIG. 3 is a table showing the results of analyzing the compositions of non-single-crystal semiconductor layers.

FIG. 10 is a table showing the result of comparing the energy of the distribution patterns of elements.

FIG. 13 is a table showing the result of calculating geometrical optimal values of $E_{VO}$.

FIG. 15 is a table showing the energy of each combination.

DETAILED DESCRIPTION OF THE INVENTION

Figure 1A:
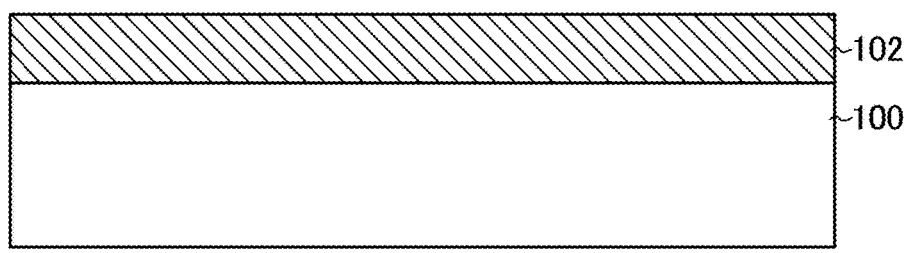
FIGS. 1A and 1B are explanatory views of a manufacturing process of an oxide semiconductor layer relating to Embodiment 1.

Embodiments will be described in detail with reference to drawings. However, the present invention is not limited to the description of embodiments given below, and it will be obvious to those skilled in the art that various changes and modifications in modes and details thereof can be made without departing from the purpose of the present invention. Further, structures relating to different embodiments can be used in combination as appropriate. Note that the same portion or a portion having the same function is denoted by the same reference numeral in structures of the present invention described below, and the repetitive explanation thereof is omitted.

Embodiment 1

In this embodiment, a method for manufacturing an oxide semiconductor layer in which crystal grains represented by $InGaO_3(ZnO)_m$ (m=1) are included in an amorphous structure represented by $InGaO_3(ZnO)_m$ (m>0) (the oxide semiconductor layer is referred to as an In—Ga—Zn—O based oxide semiconductor layer) is described with reference to drawings.

First, an In—Ga—Zn—O based non-single-crystal semiconductor layer 102 is formed over a formation surface (here, over a substrate 100) (see FIG. 1A). For example, the non-single-crystal semiconductor layer 102 can be formed by a sputtering method using an oxide semiconductor target including indium (In), gallium (Ga), and zinc (Zn). For example, the following conditions may be employed for the sputtering: a distance between the substrate 100 and the oxide semiconductor target is 30 mm to 500 mm; the pressure is 0.1 Pa to 2.0 Pa; the DC power source is 0.2 kW to 5.0 kW (when the target with a size of 8-inch in diameter is used); and the atmosphere is an argon atmosphere, an oxygen atmosphere, or a mixed atmosphere of argon and oxygen.

Here, the non-single-crystal semiconductor layer 102 is formed under the following conditions: the composition of the oxide semiconductor target is set such that the ratio of $In_2O_3:Ga_2O_3:ZnO$ equals to 1:1:1; the distance between the substrate 100 and the oxide semiconductor target is 170 mm; the pressure is 0.4 Pa; the DC power is 0.5 kW; the flow rate of an argon gas is 10 sccm; and the flow rate of an oxygen gas is 5 sccm.

Then, the composition of a sample manufactured by the above-described method is analyzed by inductively coupled plasma mass spectrometry (ICP-MS). The composition of the non-single-crystal semiconductor layer 102 formed under the conditions where the flow rate of an argon gas is 10 sccm and the flow rate of an oxygen gas is 5 sccm is $InGa_{0.94}Zn_{0.40}O_{3.31}$. FIG. 2 shows the result of the above-described analysis and the result of analyzing a non-single-crystal semiconductor layer formed under the conditions where the flow rate of an argon gas is 40 sccm and the flow rate of an oxygen gas is 0 sccm.

Further, FIG. 3 shows the results of analyses using Rutherford backscattering spectrometry (RBS) as an analysis method.

FIG. 2 and FIG. 3 show that Ga and Zn contents in a non-single-crystal semiconductor layer tend to be lower than that in the composition of the target. In addition, the results of analyzing the non-single-crystal semiconductor layers are different depending on manufacturing conditions, an analysis method, and the like.

Figure 1B:
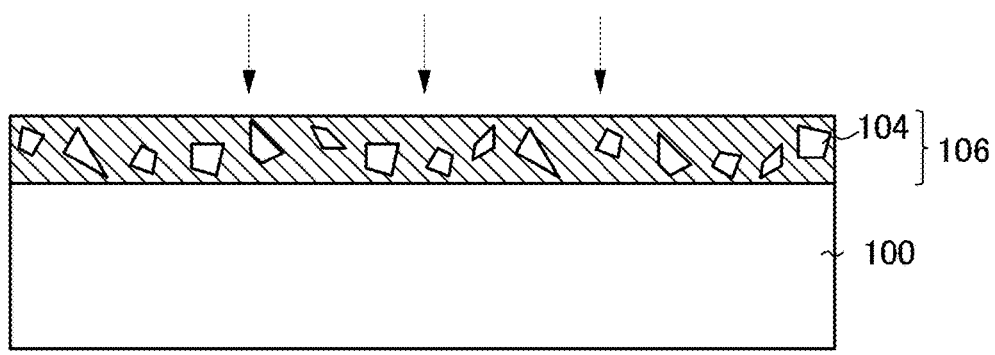

Next, the non-single-crystal semiconductor layer is subjected to heat treatment at a temperature of 350° C. to 800° C. (preferably, 500° C. to 750° C.) for about 10 minutes to 200 minutes, whereby an oxide semiconductor layer 106 including crystal grains 104 in an amorphous structure is obtained (see FIG. 1B). A thin film transistor manufactured using the oxide semiconductor layer 106 has good electrical characteristics: the on/off ratio is $10^9$ or higher and mobility is 10 cm$^2$/Vs or higher at a gate voltage of ±20 V. Note that, here, the heat treatment is performed at a temperature of 700° C. for one hour.

After the heat treatment is performed, the structure of the oxide semiconductor layer 106 is analyzed. Specifically, the cross section of the sample is observed with respect to a scanning transmission electron microscope (STEM) image.

Figure 4A:
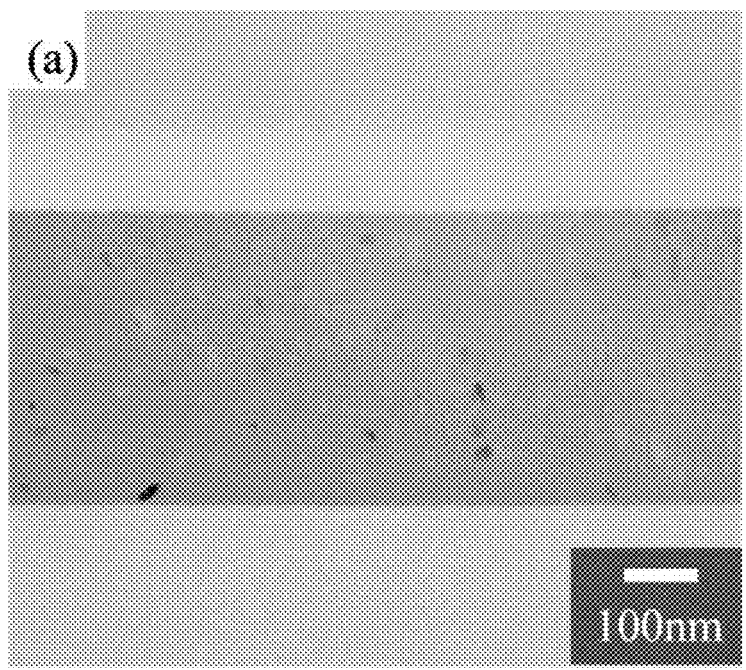
FIGS. 4A and 4B are bright-field-STEM images of oxide semiconductor layers.
Figure 4B:
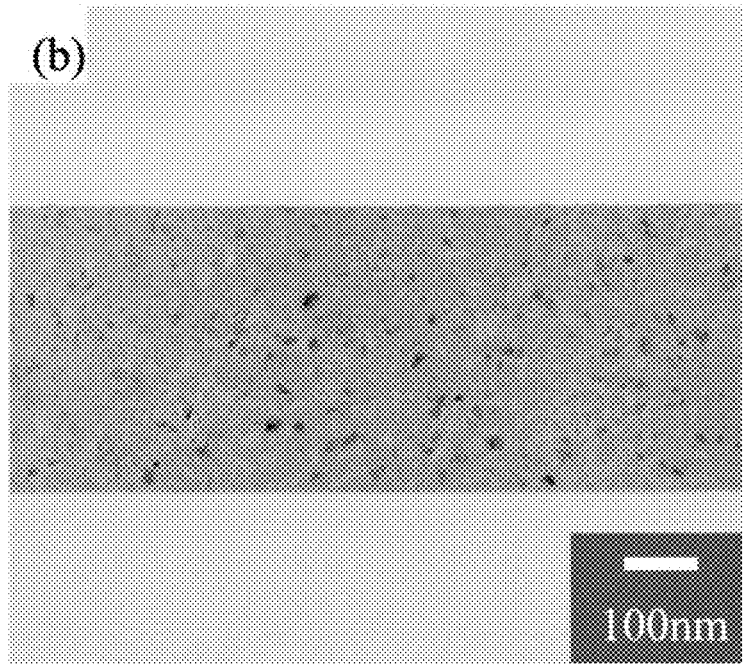

FIGS. 4A and 4B are bright-field-STEM images of the samples. FIG. 4A is a STEM image of a sample manufactured using a target of $In_2O_3:Ga_2O_3:ZnO=1:1:1$ (In:Ga:Zn=1:1:0.5) (hereinafter, a target A). FIG. 4B is a STEM image of a sample manufactured using a target of $In_2O_3$:

$Ga_2O_3$:ZnO=1:1:2 (In:Ga:Zn=1:1:1) (hereinafter, a target B) instead of the target A for comparison with the above sample.

FIG. 4A shows that the oxide semiconductor layer 106 manufactured by the above method has a structure including the crystal grains 104 in the amorphous structure.

Note that as seen from the comparison between FIG. 4A and FIG. 4B, in the case where a Zn content in a target is low, the speed of crystal growth is lower than that in the case where a Zn content in a target is high. By utilizing this fact, the controllability of crystal growth can be improved. For example, the Zn content (atomic %) in the non-single-crystal semiconductor layer 102 is made lower than the In content (atomic %) and lower than the Ga content (atomic %), whereby the oxide semiconductor layer 106 with good properties can be formed with good controllability. When the speed of crystal growth is valued, the zinc content in the non-single-crystal semiconductor layer 102 may be made high.

Figure 5A:
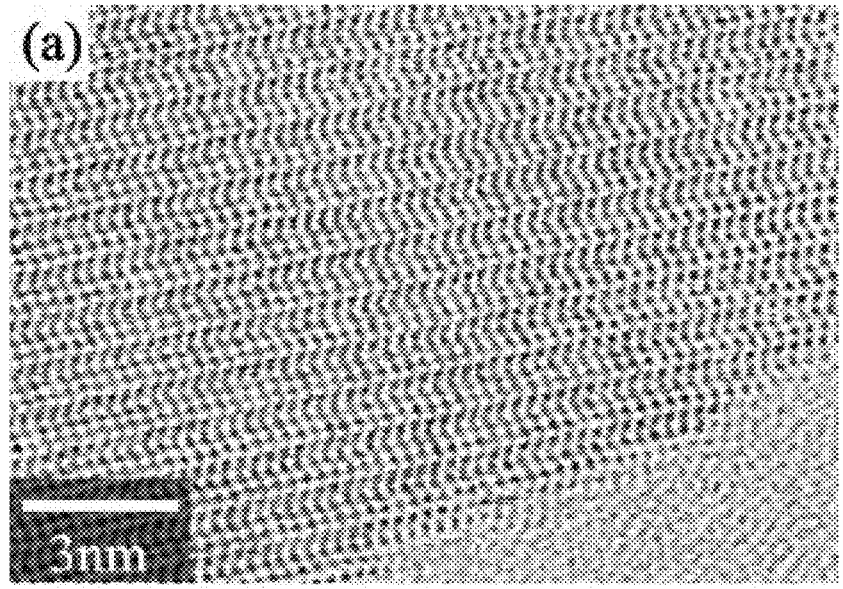
FIGS. 5A and 5B are a bright-field-STEM image and a HAADF-STEM image, respectively.
Figure 5B:
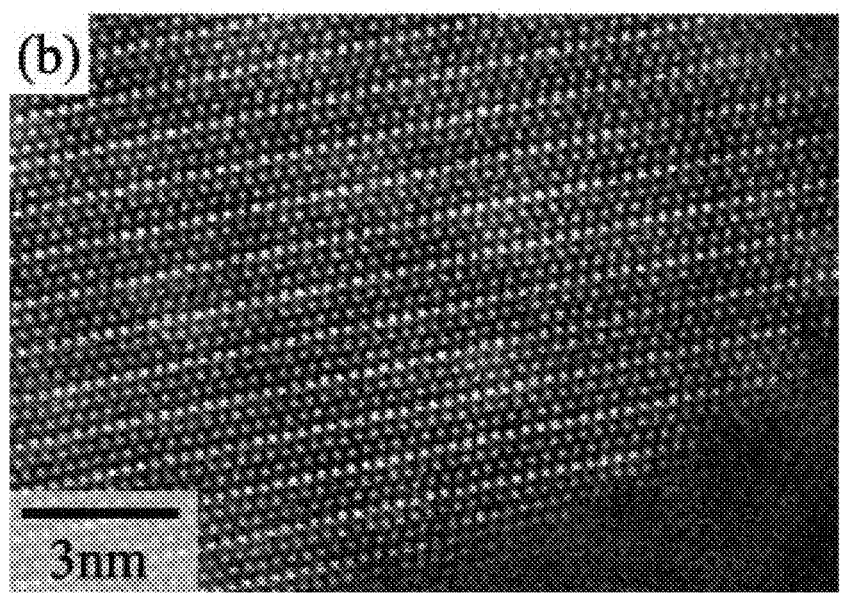

Next, a minuter region of the sample is observed by a STEM. FIGS. 5A and 5B are STEM images of the sample manufactured using the target A. FIG. 5A is a bright-field-STEM image, and FIG. 5B is a high-angle annular dark field (HAADF)-STEM image. In FIG. 5A, a regular structure can be seen; however, it is difficult to locate each atom, and in addition, crystal orientation cannot be detected. On the other hand, in FIG. 5B, the positions of white dots corresponding to each atom can be precisely detected. Further, as can be seen from FIG. 5B, an amorphous structure is left in a lower right region of FIG. 5B.

In a HAADF-STEM image, a contrast proportional to the square of an atomic number is obtained; therefore, the brighter dot indicates the heavier atom. In FIG. 5B, brighter dots represent In and darker dots represent Ga or Zn.

Figure 6A:
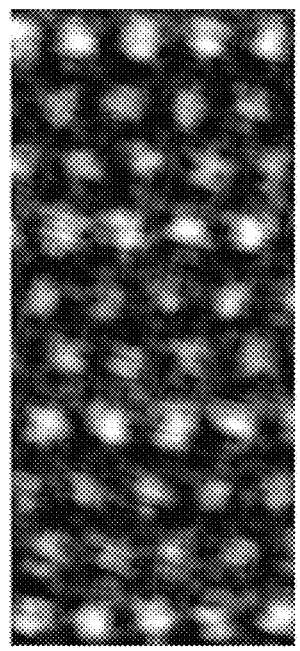
FIGS. 6A and 6B are an enlarged image of a crystal structure and a model view of the crystal structure, respectively.
Figure 6B:
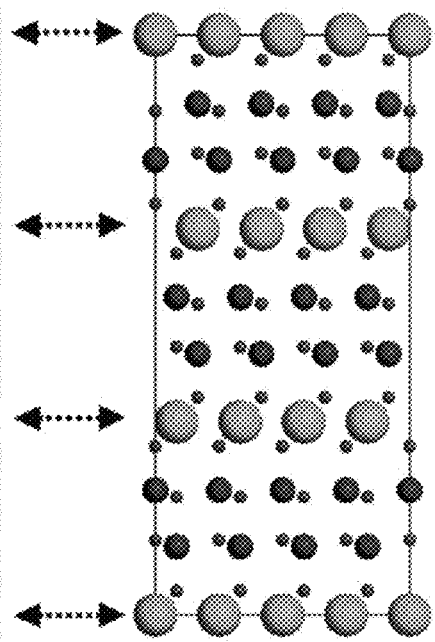

Next, the above crystal structure is considered with reference to FIGS. 6A and 6B. Here, FIG. 6A is an enlarged view (an enlarged image) of FIG. 5B. FIG. 6B is a model view of the crystal structure of $InGaZnO_4$ (corresponding to $InGaO_3(ZnO)_m$, where m is 1) which is seen from a [100] direction. A comparison between FIGS. 6A and 6B shows that crystal grains in the sample manufactured using the target A has a crystal structure of $InGaO_3(ZnO)_1$. Note that it is likely that In and Ga contribute to electrical conduction in an In—Ga—Zn—O based oxide semiconductor. Therefore, in order to maintain good electrical characteristics, the higher the proportion of a crystal structure with a high proportion of In and Ga is, in other words, the higher the proportion of the crystal structure of $InGaO_3(ZnO)_m$ (m=1) is, the more preferable.

Figure 7A:
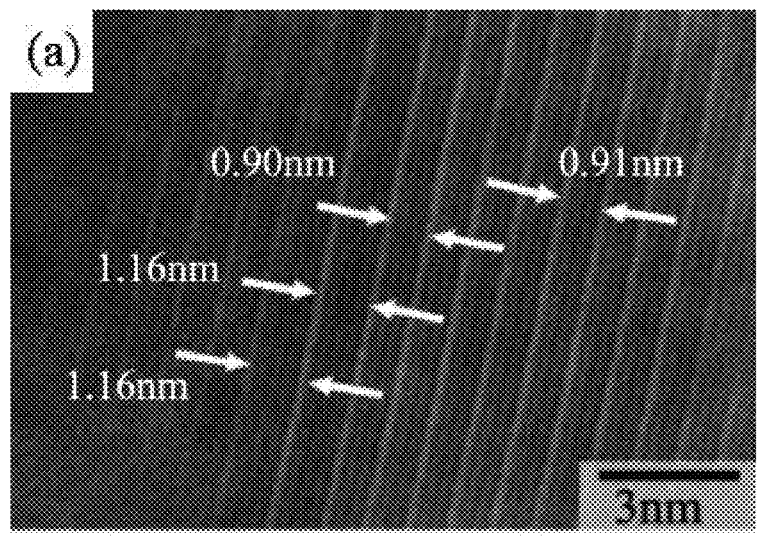
FIGS. 7A and 7B are HAADF-STEM images of an oxide semiconductor layer (a target B).
Figure 7B:
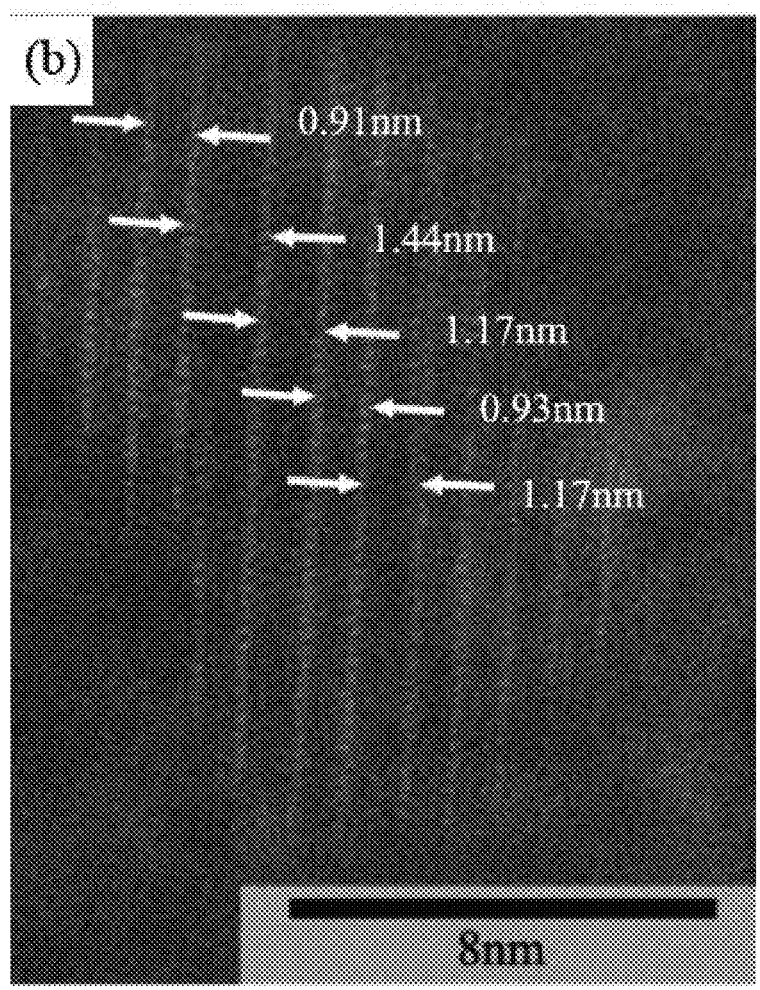

FIGS. 7A and 7B are HAADF-STEM images of a sample manufactured using the target B. In FIGS. 7A and 7B, bright dots are regularly present so as to form lines. The distances between lines of the bright dots are approximately 0.9 nm, approximately 1.15 nm, and approximately 1.4 nm, which correspond to the distances between indium atoms in the crystal structures of $InGaO_3(ZnO)_m$ where m=1, m=2, and m=3, respectively. That is, it can be said that the sample manufactured using the target B has crystals of a plurality of compositions, i.e., crystals of $InGaO_3(ZnO)_m$ where m is at least 1 to 3.

As described above, in an In—Ga—Zn—O based oxide semiconductor, In and Ga contribute to electrical conduction. Therefore, under the conditions where the proportion of In and Ga is low (that is, under the condition where m is large), the electrical characteristics get worse. Thus, by making the proportion of the structure of $InGaO_3(ZnO)_m$ (m=1) high, the electrical characteristics can be maintained in a good state. In specific, the proportion of the crystal structure of $InGaO_3(ZnO)_m$ (m=1) in the whole crystal structure is preferably 80 volume % or higher, more preferably 90 volume % or higher.

As one method for making the proportion of the crystal structure of $InGaO_3(ZnO)_m$ (m=1) high, there is a method for forming the non-single-crystal semiconductor layer 102 with a low Zn content by using a target with a low Zn content. For example, a Zn content (atomic %) in the non-single-crystal semiconductor layer 102 may be lower than an In content (atomic %) and lower than a Ga content (atomic %) in the non-single-crystal semiconductor layer 102. A Zn content in the non-single-crystal semiconductor layer 102 is made low, whereby the crystal structure with good electrical characteristics can be obtained.

The electronic structure of an In—Ga—Zn—O based oxide semiconductor has not been sufficiently elucidated, and it is likely that the elucidation of the electronic structure leads to understanding of electrical characteristics of an oxide semiconductor. Thus, the result of calculating an In—Ga—Zn—O based oxide semiconductor by the first principle calculation and the consideration thereof are described below. Note that although the result given below is obtained by calculating the crystal structure, the result can be similarly adapted to an amorphous structure including crystal grains.

Figure 8:
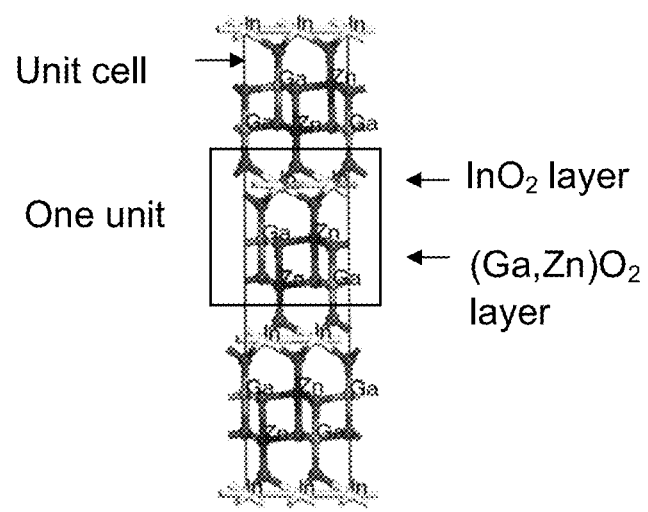
FIG. 8 is a view illustrating a crystal structure of an oxide semiconductor ($InGaZnO_4$).

FIG. 8 illustrates the crystal structure of an In—Ga—Zn—O based oxide semiconductor ($InGaZnO_4$) which is obtained by calculation. The unit cell of the crystal structure of $InGaZnO_4$ includes 21 atoms. However, here, the calculation is performed with respect to an enlarged unit including 84 atoms (2×2×1) in order to examine the distribution of Ga atoms.

The calculation is performed using CASTEP. CASTEP is a first principle calculation program based on the density functional theory (DFT) and the plane wave pseudo-potential method. For exchange correlation functional, generalized-gradient approximation (GGA) and Perdew-Burke-Ernzerhof (PBE) are selected here. The cut-off energy is set to 500 eV, and the K-point grid of 3×3×1 is used.

FIG. 8 shows that the unit cell includes two (Ga, Zn)$O_2$ layers and one $InO_2$ layer. Note that here, the crystal structure with repeated unit cells including specified atom distribution is assumed for simplicity.

Figure 9A:
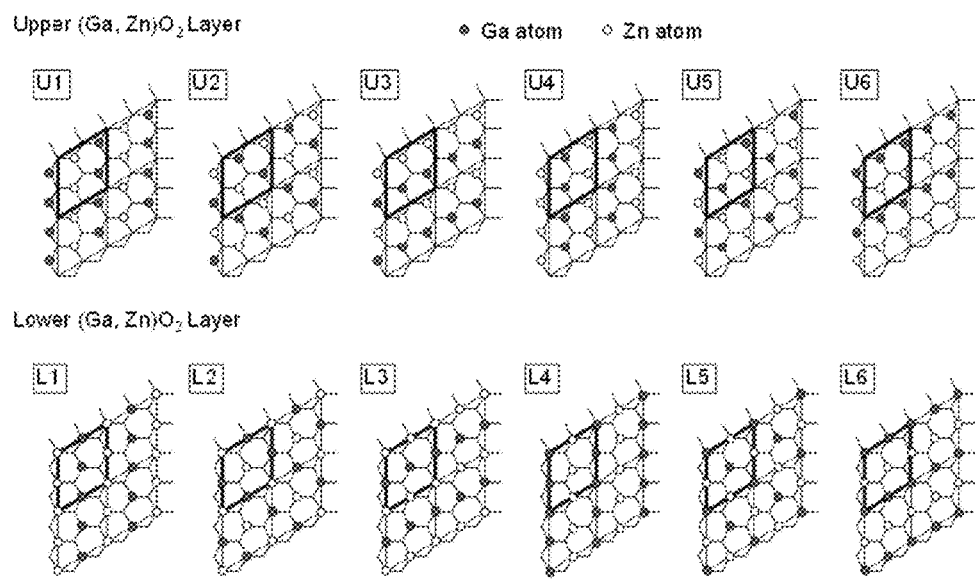
FIGS. 9A and 9B are views illustrating the distributions of Ga atoms and Zn atoms in $(Ga, Zn)O_2$ layers.
Figure 9B:
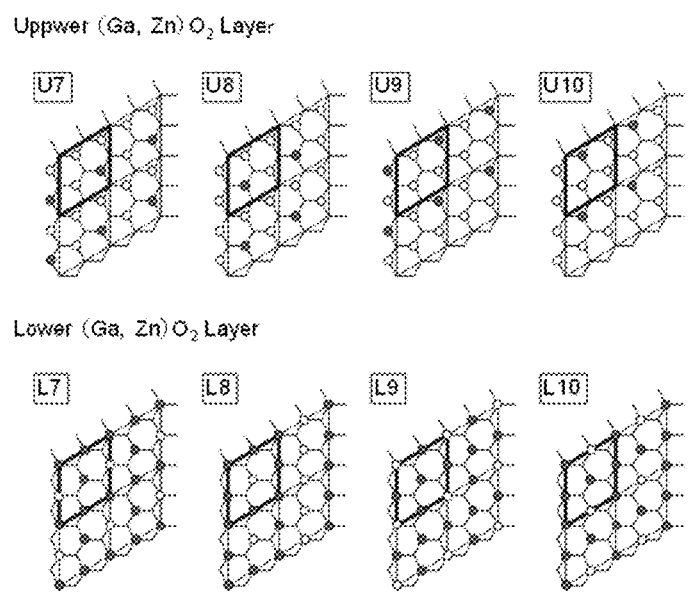

FIGS. 9A and 9B show the distributions of Ga atoms and Zn atoms in two (Ga, Zn)$O_2$ layers in unit cells. FIGS. 9A and 9B show structures of 2×2 times unit cells, i.e., structures each including 4 unit cells. Further, heavy lines in FIGS. 9A and 9B represent a unit cell. FIG. 9A shows the case where two Ga atoms are present in each of an upper and a lower layer, and FIG. 9B shows the case where one Ga atom is present in an upper layer and three Ga atoms are present in a lower layer.

In the case shown in FIG. 9A, Ga atoms in each layer are distributed in the form of stripes. That is, Ga atoms in each layer are distributed in the form of parallel lines.

Considering the combination of the upper and the lower layers, the distributions of Ga atoms are classified into two patterns: a parallel distribution and a cross distribution. The parallel distribution refers to the distribution where Ga lines in the upper layer are in parallel to Ga lines in the lower layer, and the cross distribution refers to the distribution where Ga lines in the upper layer cross Ga lines in the lower layer. In the case of the parallel distribution, there are two possible combinations such as U1+L1 and U1+L4. In the case of the cross distribution, the distribution has a rotationally symmetrical relation; therefore, only one combination like U1+L2 is considered, for example. That is, there are three combinations in total in the case shown in FIG. 9A.

In the case shown in FIG. 9B, as combinations of the upper and the lower layers, there are two possible combinations such as U7+L7 and U7+L10. Note that in the case where all Ga atoms enter either the upper layer or the lower layer, there is one combination of the upper and the lower layers (U11+L11, not shown). Therefore, for the Ga distribution, six combinations may be considered in total.

FIG. 10 shows the result of comparing the energy of the six distribution patterns. InGaZnO$_4$ has the lowest energy in the case where two Ga atoms are present in each of the upper and the lower layer, more specifically, in the case of the structure like U1+L1.

Figure 11:
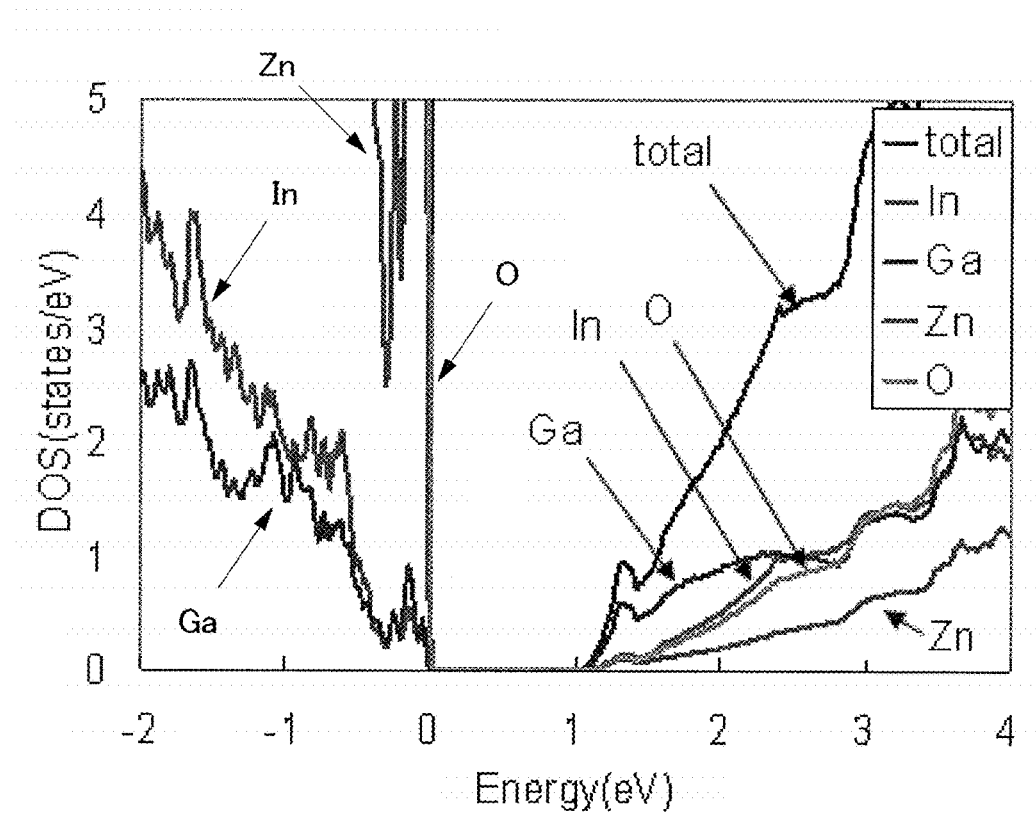
FIG. 11 is a view illustrating the result of calculating DOS and PDOS of electrons.

The electronic structure of this structure (the structure having the lowest energy) is calculated in more detail. FIG. 11 shows the result of calculating density of state (DOS) and projected density of state (PDOS) of electrons in the above structure. According to FIG. 11, Ga atoms are the most dominant, followed by In atoms.

Figure 12A:
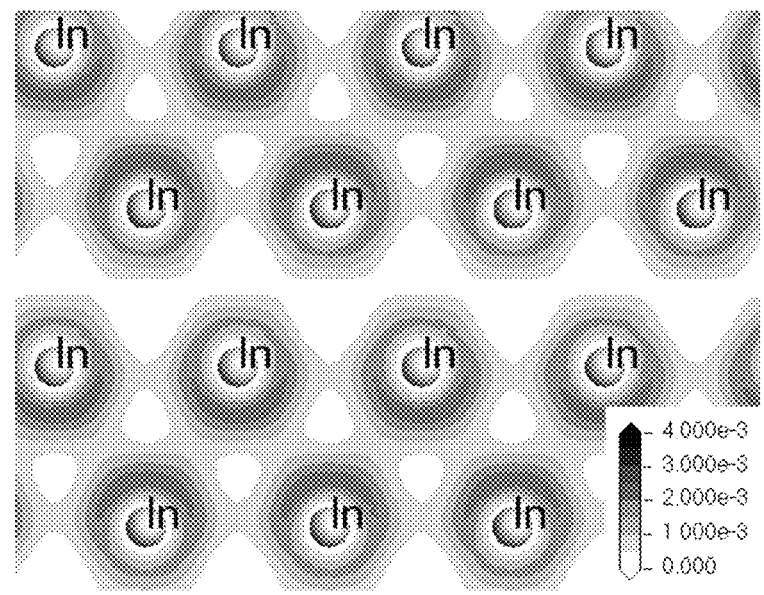
FIGS. 12A and 12B are distribution maps of electrons at the bottom of the conduction band.
Figure 12B:
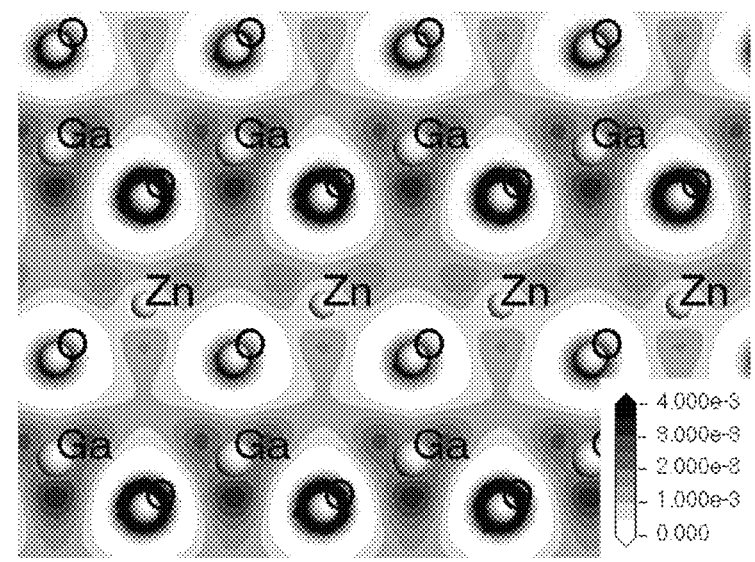
Figure 14A:
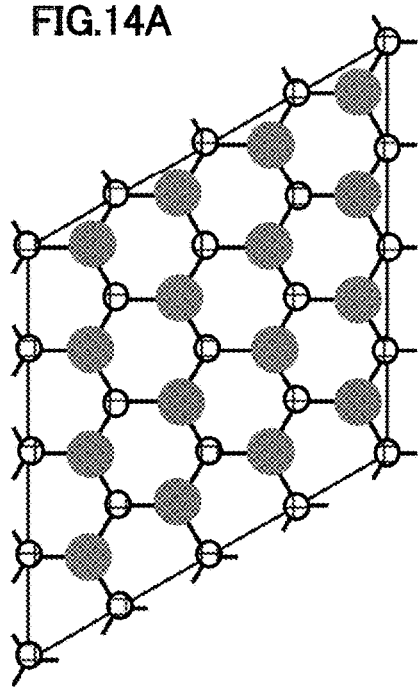
FIGS. 14A to 14D are views illustrating specific combinations (the distributions of atoms) relating to calculation.
Figure 14B:
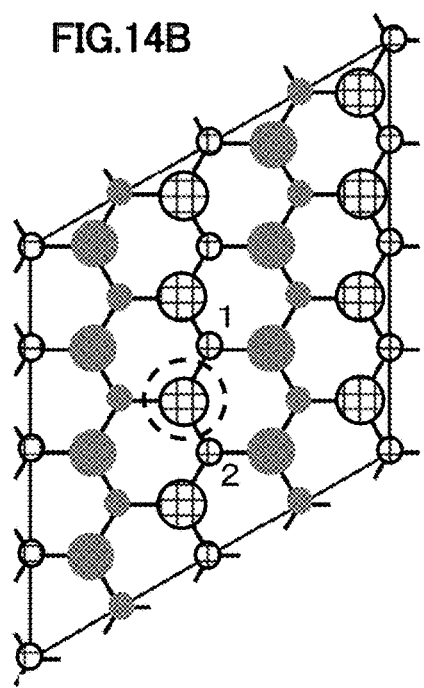
Figure 14C:
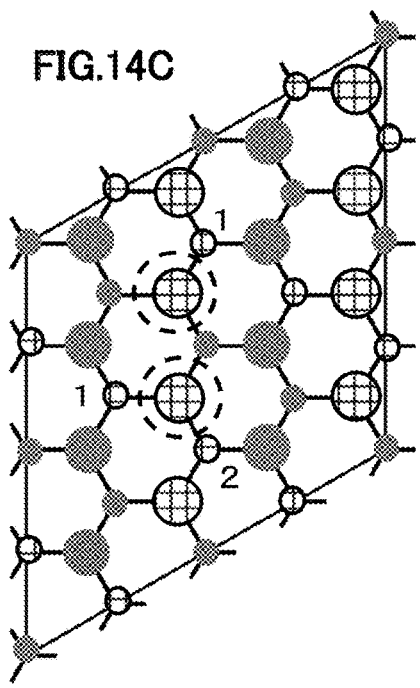
Figure 14D:
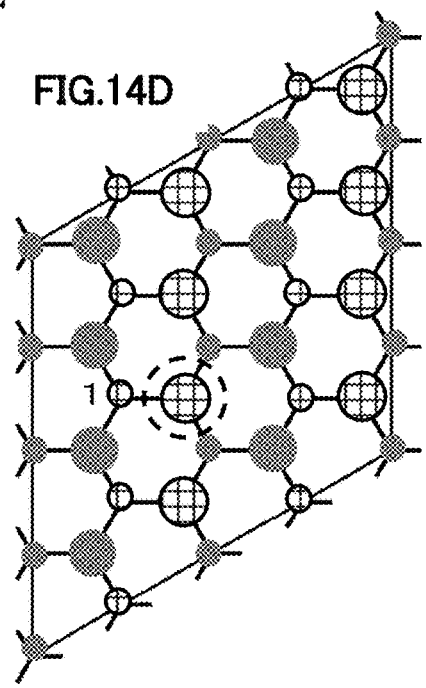

Next, the existing probability of electron $|\Psi|^2$ at the bottom of the conduction band is calculated from an orbital function $\Psi$ at the bottom of the conduction band. FIGS. 12A and 12B show distribution maps thereof. Here, FIG. 12A shows the existing probability of electrons on the plane of In (in the InO$_2$ layer), and FIG. 12B shows the existing probability of electrons in the (Ga, Zn)O$_2$ layer. It is interesting that the In orbitals are separated.

FIG. 12B shows that the existing probability of electrons in the periphery of Ga atoms is high and the existing probability of electrons in the periphery of Zn atoms is low. Further, the electrical conduction path appears to be present not only on the plane of In but also in the (Ga, Zn)O$_2$ layer. From this, it is likely that Ga largely contributes to the electrical conduction of InGaZnO$_4$. It seems that the Ga orbital affects the In orbital and contributes to the electrical conduction of the (Ga, Zn)O$_2$ layer.

One of the features of InGaZnO$_4$ is a wide margin of electrical conductivity. This seems to be due to the probability of formation of oxygen vacancies (defects) because the electrical conductivities widely vary depending on the amount of oxygen added in a process. Thus, in order to clarify this mechanism, the formation energy of oxygen vacancies is calculated.

The energy level of an oxygen vacancy defect which is calculated based on the density functional theory (DFT) is still being argued. For example, a band gap obtained by using a function such as local density approximation (LDA) or GGA tends to be smaller than an actual measurement value. Since the scaling method is still being discussed, the simple GGA function without the scaling method is used here. It is likely that, by using this, artificial phenomena are eliminated and the essence of phenomena can be grasped.

The formation energy of oxygen vacancies (E$_{VO}$) is defined as follows:

$$E_{VO}=E(A_mO_{n-1})+E(O)-E(A_mO_n)$$

Here, E$_{VO}$ is a half of the energy of an oxygen molecule, and E(A$_m$O$_{n-1}$) represents the energy of A$_m$O$_{n-1}$ having oxygen vacancies where A represents an optional element.

FIG. 13 shows the result of calculating geometrical optimal values of E$_{VO}$ in a structure having oxygen vacancies. Here, as a lattice constant, a lattice constant of an ideal crystal is used. High level of E$_{VO}$ means that the density of oxygen vacancies in thermal equilibrium is low. Note that, in FIG. 13, E$_{VO}$ of In$_2$O$_3$, E$_{VO}$ of ZnO, and E$_{VO}$ of Ga$_2$O$_3$ are also shown. Crystal structures of In$_2$O$_3$, ZnO, and Ga$_2$O$_3$ are bixbyite, wurtzite, β-gallia, respectively.

E$_{VO}$ of InGaZnO$_4$ varies depending on elements in the periphery of oxygen vacancies. Specifically, there are three possible structural models as follows. In Model 1, an oxygen vacancy is surrounded by one Zn atom and three In atoms. In Model 2, an oxygen vacancy is surrounded by one Ga atom and three In atoms. In Model 3, an oxygen vacancy is surrounded by two Zn atoms and two Ga atoms. FIG. 13 shows that the level of E$_{VO}$ of InGaZnO$_4$ becomes higher as the number of Ga atoms in the periphery of the oxygen vacancy increases. Further, Ga$_2$O$_3$ has the highest level of E$_{VO}$ in FIG. 13; therefore, it can be said that Ga atoms bond with O atoms tightly.

When InGaZnO$_4$ is in an amorphous state, there are more possible structures in addition to the above three types of models, and the levels of E$_{VO}$ of the structures are slightly different from each other. As the proportion of Ga atoms in InGaZnO$_4$ increases, the density of oxygen vacancies decreases. As the proportion of Ga atoms in InGaZnO$_4$ decreases, the density of oxygen vacancies increases.

Thus, making the proportion of Ga atoms in the non-single-crystal semiconductor layer 102 high enables reduction of the density of oxygen vacancies. That is, an In—Ga—Zn—O based oxide semiconductor with good electrical characteristics can be obtained. Considering the existence of In contributing to electrical conduction, it is not preferable to reduce the proportion of In. Therefore, the proportion of Zn in the non-single-crystal semiconductor layer 102 is preferably made low. For example, the Zn content (atomic %) in the non-single-crystal semiconductor layer 102 may be lower than the In content (atomic %) and lower than the Ga content (atomic %). By making the Zn content in the non-single-crystal semiconductor layer 102 low in this manner, an oxide semiconductor layer with good electrical characteristics can be obtained.

According to this embodiment, a high-performance oxide semiconductor layer can be provided. This embodiment can be implemented in combination with any of other embodiments as appropriate.

Embodiment 2

In this embodiment, the result of promoting the consideration of an In—Ga—Zn—O based oxide semiconductor layer in Embodiment 1 is described with reference to drawings.

It is revealed in Embodiment 1 that two (Ga, Zn)O$_2$ layers and one InO$_2$ layer are included in a unit cell of a crystal structure of InGaZnO$_4$. In response to this, the distribution of Ga atoms and Zn atoms is studied in more detail in this embodiment. In specific, some combinations of an upper layer and a lower layer are given as shown in FIGS. 9A and 9B, and the relation between the distribution of Ga atoms and Zn atoms in two (Ga, Zn)O$_2$ layers and the energy is calculated and considered.

FIGS. 14A to 14D illustrate specific combinations (the distributions of atoms) which are subjected to calculation. In this embodiment, these combinations are selected with a focus on the number of nearest neighbor atoms of the same kind. For example, in a combination shown in FIG. 14A, Ga atoms and Zn atoms are distributed in the upper layer and in the lower layer, respectively, such that the Ga atoms and the Zn atoms are separated from each other, whereby the number of nearest neighbor atoms of the same kind is made zero. In a combination shown in FIG. 14B, two atoms of the same kind are present in nearest neighbor positions. In a combination shown in FIG. 14C, one and a half atoms of the same kind are present in nearest neighbor positions. In a combination shown in FIG. 14D, one atom of the same kind is present in a nearest neighbor position. The calculation is performed under the same conditions as Embodiment 1.

FIG. 15 shows the calculation result. In FIG. 15, the structure with the lowest energy is regarded as an origin point (the energy is regarded as 0 eV) to show the energy of each structure.

Figure 16:
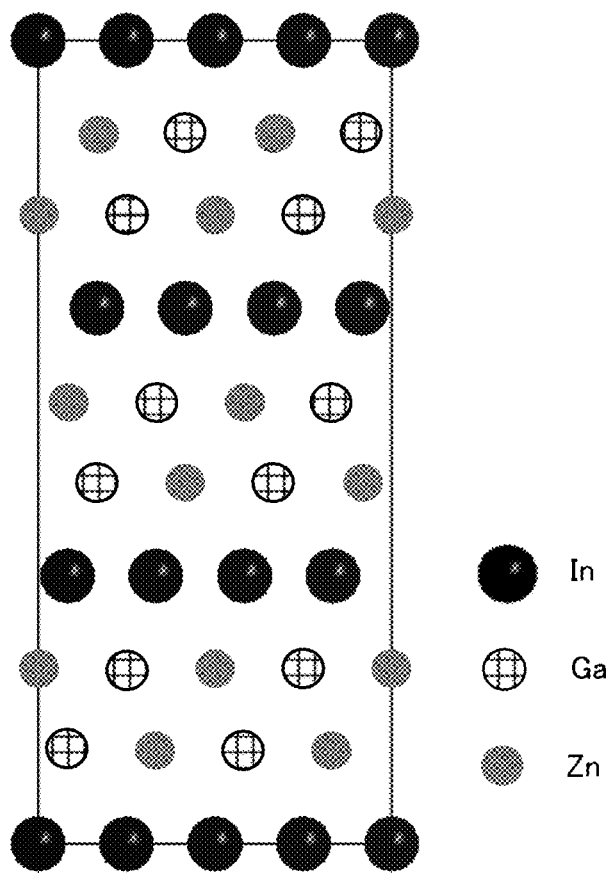
FIG. 16 is a model view of the most possible distribution.

Although the distributions examined in this embodiment are only part of a number of distributions, the tendency of the distribution of Ga atoms and Zn atoms can be read from FIG. 15. It is likely that the result shown in FIG. 15 show that the structure becomes stable in terms of energy as the degree of aggregation of atoms of the same kind becomes lower. Thus, it can be concluded that, in the crystal structure of InGaZnO$_4$, Ga atoms and Zn atoms are not present in an aggregation state as GaO or ZnO but are distributed to be mixed each other in an atom state. FIG. 16 shows a model view of the most possible distribution (corresponding to the distribution (d) in FIG. 15).

This embodiment can be implemented in combination with any of other embodiments as appropriate.

Embodiment 3

In this embodiment, an example of a manufacturing process of a semiconductor device using an oxide semiconductor layer manufactured by the method described in Embodiment 1 or the like is described with reference to FIGS. 17A to 17E. Note that in this embodiment, the detailed description of the content which is the same or substantially the same as in Embodiment 1 or the like is omitted.

Figure 17A:
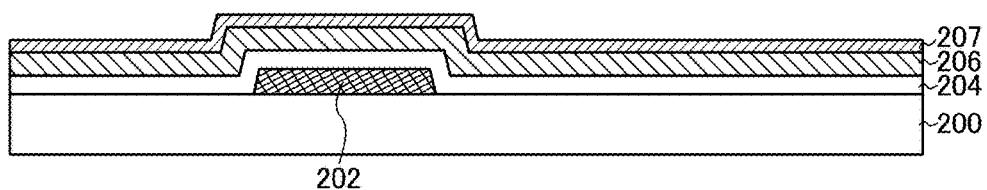
FIGS. 17A to 17E are explanatory views of a manufacturing process of a semiconductor device relating to Embodiment 2.
Figure 17B:
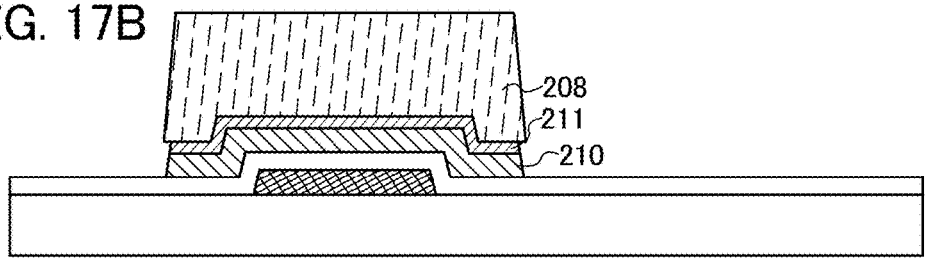

First, a gate electrode 202 is formed over a substrate 200 having an insulating surface, and a gate insulating layer 204 is formed over the gate electrode 202; then, an oxide semiconductor layer 206 and an oxide semiconductor layer 207 are stacked (see FIG. 17A).

As the substrate 200 having an insulating surface, for example, a glass substrate having a visible light transmitting property, which is used for a liquid crystal display device or the like, can be used. The glass substrate is preferably an alkali-free glass substrate. As an alkali-free glass substrate, for example, a glass material such as aluminosilicate glass, aluminoborosilicate glass, or barium borosilicate glass is used. In addition, as the substrate 200 having an insulating surface, an insulating substrate which is formed using an insulator, such as a resin substrate, a ceramic substrate, a quartz substrate, or a sapphire substrate; a semiconductor substrate which is formed using a semiconductor material such as silicon and whose surface is covered with an insulating material; a conductive substrate which is formed using a conductor such as metal or stainless steel and whose surface is covered with an insulating material; or the like can also be used. From the viewpoint of increasing the area of a semiconductor device, specifically, a glass substrate is preferably used. Further, the substrate 200 having an insulating surface preferably has a given heat resistant property.

A conductive layer is formed over an entire surface of the substrate 200 and then the conductive layer is selectively etched using a resist mask formed by a photolithography method, whereby the gate electrode 202 can be formed. At this time, in order to improve the coverage of the gate electrode 202 with the gate insulating layer 204 formed later and preventing disconnection, the gate electrode 202 is preferably etched so that end portions thereof have a tapered shape. Note that the gate electrode 202 includes an electrode and a wiring, such as a gate wiring, formed using the conductive layer.

The gate electrode 202 is desirably formed using a low resistance conductive material such as aluminum (Al) or copper (Cu). Note that in the case where aluminum is used for the wiring and the electrode, aluminum has disadvantages such as low heat resistance and a tendency to be corroded when aluminum is used by itself; therefore, aluminum is preferably used in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc), an alloy including any of the above elements as its component, an alloy including a combination of any of these elements, a nitride including any of the above elements as its component, or the like can be used. A film formed using such a heat-resistant conductive material and aluminum (or copper) are stacked, so that the wiring and the electrode can be formed.

The gate insulating layer 204 can be formed using a silicon oxide film, a silicon oxynitride film, a silicon nitride film, a silicon nitride oxide film, an aluminum oxide film, a tantalum oxide film, or the like. Alternatively, the gate insulating layer 204 may be formed using a stack of these films. The film can be formed to a thickness of 20 nm to 250 nm inclusive by a sputtering method or the like. For example, as the gate insulating layer 204, a silicon oxide film is formed to a thickness of 100 nm by a sputtering method. Note that the gate insulating layer 204 may serve as a gate insulating layer of a transistor, and the manufacturing method, the thickness, and the like of the gate insulating layer 204 are not construed as being limited to the range of the numeric values described above.

Note that before the oxide semiconductor layer 206 is formed over the gate insulating layer 204, a surface of the gate insulating layer 204 may be subjected to plasma treatment. Dust attaching to the surface of the gate insulating layer 204 can be removed by the plasma treatment.

An inert gas such as an argon (Ar) gas is introduced into a vacuum chamber, and a bias voltage is applied to a processing object (here, the substrate 200 over which the gate insulating layer 204 is formed) so that a plasma state is generated, whereby the above-described plasma treatment can be performed. In this case, electrons and cations of Ar are present in the plasma and the cations of Ar are accelerated in a cathode direction (toward the substrate 200 side). The accelerated cations of Ar collide with the surface of the gate insulating layer 204, whereby the surface of the gate insulating layer 204 is etched by sputtering so as to be reformed. In place of an argon gas, a helium gas may be used. Alternatively, the plasma treatment may be performed in an argon atmosphere to which oxygen, hydrogen, nitrogen, and/or the like is added. Further alternatively, the plasma treatment may be performed in an argon atmosphere to which chlorine (Cl$_2$), carbon tetrafluoride (CF$_4$), and/or the like is added. Such plasma treatment described above may also be referred to as "reverse sputtering".

The oxide semiconductor layer 206 can be formed using an In—Ga—Zn—O based non-single-crystal semiconductor layer. For example, the oxide semiconductor layer 206 is formed by a sputtering method using an oxide semiconductor target including indium (In), gallium (Ga), and zinc (Zn) (In$_2$O$_3$:Ga$_2$O$_3$:ZnO=1:1:1). For the sputtering conditions, Embodiment 1 and the like can be referred to.

Note that a pulsed DC power source is preferably used in the sputtering because dust can be reduced and thickness can be uniformed. In addition, the above plasma treatment is performed and then the oxide semiconductor layer 206 is formed without being exposed to the air, so that dust or moisture can be prevented from attaching to the interface between the gate insulating layer 204 and the oxide semiconductor layer 206. The thickness of the oxide semiconductor layer 206 may be approximately 5 nm to 500 nm.

The oxide semiconductor layer 207 can be formed using an In—Ga—Zn—O based non-single-crystal semiconductor layer in a manner similar to the oxide semiconductor layer 206. For example, the oxide semiconductor layer 207 can be formed over the oxide semiconductor layer 206 by a sputtering method using an oxide semiconductor target including In, Ga, and Zn ($In_2O_3$:$Ga_2O_3$:ZnO=1:1:1). At this time, it is preferable that the oxide semiconductor layer 207 be successively formed without exposing the oxide semiconductor layer 206 to the air. For example, the following conditions may be employed for the sputtering: the temperature is 20° C. to 100° C.; the pressure is 0.1 Pa to 2.0 Pa; and the DC power source is 250 W to 3 kW (when the target with a size of 8-inch in diameter is used). Further, an argon gas may be introduced into the atmosphere.

The oxide semiconductor layer 206 and the oxide semiconductor layer 207 are preferably formed under the different film formation conditions. For example, in the film formation conditions of the oxide semiconductor layer 206, the flow rate ratio of an oxygen gas to an argon gas is made higher than that in the film formation conditions of the oxide semiconductor layer 207. Specifically, the oxide semiconductor layer 207 is formed in a noble gas (such as argon or helium) atmosphere (or an atmosphere containing oxygen at 10% or less and a noble gas at 90% or more), and the oxide semiconductor layer 206 is formed in an oxygen atmosphere or an atmosphere in which the flow rate of an oxygen gas is equal to or more than the flow rate of a noble gas). Accordingly, the oxide semiconductor layer 207 which is higher in electrical conductivity than the oxide semiconductor layer 206 can be formed.

As the above sputtering method for forming the oxide semiconductor layer 206 and the oxide semiconductor layer 207, an RF sputtering method in which a high frequency power source is used as a sputtering power source, a DC sputtering method, a pulsed DC sputtering method in which direct current bias is applied in pulses, or the like can be employed.

Alternatively, a multi-target sputtering apparatus which can be provided with a plurality of targets formed using different materials may be used. In a multi-target sputtering apparatus, a stack of different films can be formed in one chamber, or one film can be formed by sputtering using plural kinds of materials at the same time in one chamber. Alternatively, a method using a magnetron sputtering apparatus in which a magnetic field generating system is provided inside the chamber (a magnetron sputtering method), an ECR sputtering method in which plasma generated by using a microwave is used, or the like may be employed. Further alternatively, a reactive sputtering method in which a target substance and a sputtering gas component are chemically reacted with each other to form a compound thereof at the time of film formation, a bias sputtering method in which a voltage is applied also to the substrate at the time of film formation, or the like may be employed.

Note that in this embodiment, an example of the case where the oxide semiconductor layer 206 and the oxide semiconductor layer 207 are stacked is described; however, the invention to be disclosed is not limited thereto. For example, the structure without the oxide semiconductor layer 207 (the structure in which only the oxide semiconductor layer 206 is formed) may be used.

Next, a resist mask 208 is formed over the oxide semiconductor layer 207. Then, the oxide semiconductor layer 206 and the oxide semiconductor layer 207 are selectively etched using the resist mask 208, so that an island-shaped oxide semiconductor layer 210 and an island-shaped oxide semiconductor layer 211 are formed (see FIG. 17B).

As the above etching, wet etching is preferably employed. Here, the island-shaped oxide semiconductor layer 210 and the island-shaped oxide semiconductor layer 211 are formed by removing an unnecessary portion of the oxide semiconductor layer 206 and the oxide semiconductor layer 207 by wet etching with the use of ITO07N (manufactured by Kanto Chemical Co., Inc.) or a mixed solution of acetic acid, nitric acid, and phosphoric acid. Note that after the above etching, the resist mask 208 is removed. In addition, an etchant for the wet etching is not limited to the above solution as long as the oxide semiconductor layer 206 and the oxide semiconductor layer 207 can be etched using the etchant. Of course, dry etching may be used as the above etching.

Figure 17C:
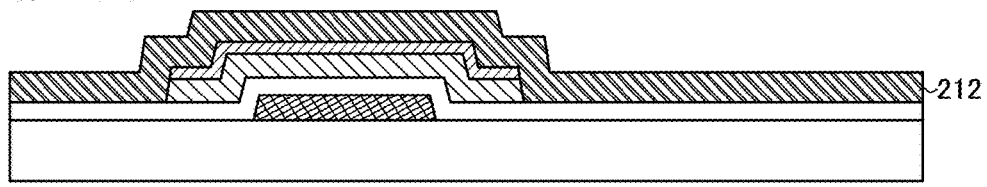

Next, a conductive layer 212 is formed over the island-shaped oxide semiconductor layer 211 (see FIG. 17C).

The conductive layer 212 can be formed by a sputtering method, a vacuum evaporation method, or the like, using a metal including an element selected from aluminum (Al), copper (Cu), titanium (Ti), tantalum (Ta), tungsten (W), molybdenum (Mo), chromium (Cr), neodymium (Nd), and scandium (Sc), an alloy including any of the above elements as its component, an alloy including a combination of any of these elements, or a nitride including any of the above elements as its component. Note that in this embodiment, heat treatment (e.g., heat treatment at 350° C. to 800° C. (preferably, 500° C. to 750° C.)) is performed after formation of the conductive layer 212; therefore, the conductive layer 212 preferably has a given heat resistant property.

For example, the conductive layer 212 can be formed with a single-layer structure of a titanium film. Alternatively, the conductive layer 212 is formed with a stacked-layer structure. For example, the conductive layer 212 can be formed with a stacked-layer structure of an aluminum film and a titanium film. Further alternatively, a three-layer structure of a titanium film, an aluminum film including a neodymium (Al—Nd) film, and a titanium film may be employed. Further alternatively, the conductive layer 212 may be formed with a single-layer structure of an aluminum film including silicon.

Next, a resist mask 214a, a resist mask 214b, and a resist mask 214c are formed over the conductive layer 212, and the conductive layer 212 is selectively etched so that a conductive layer 216a, a conductive layer 216b, and a conductive layer 218 are formed. In addition, the island-shaped oxide semiconductor layer 211 is etched so that a semiconductor region 215a with high conductivity and a semiconductor region 215b with high conductivity are formed. Further, part of the island-shaped oxide semiconductor layer 210 (the part near a surface thereof) is removed (channel-etched) (see FIG. 17D).

Figure 17D:
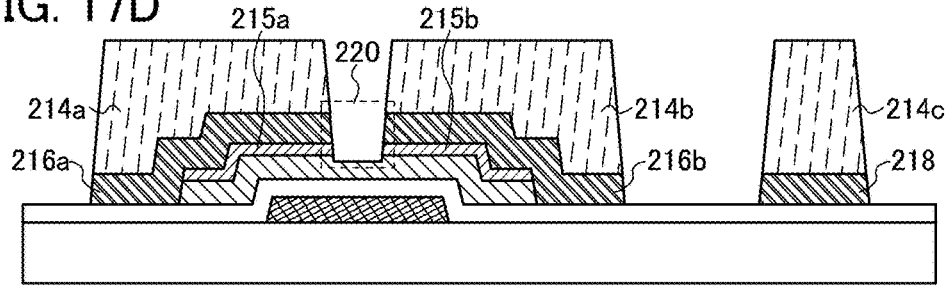

A recessed portion 220 formed by removing the part of the island-shaped oxide semiconductor layer 210 and part of the island-shaped oxide semiconductor layer 211 corresponds to a region which is between the conductive layer 216a and the conductive layer 216b and also between the semiconductor region 215a with high conductivity and the semiconductor region 215b with high conductivity. Therefore, the conductive layer 216a functions as one of a source electrode and a drain electrode of the transistor, while the conductive layer 216b functions as the other of the source electrode and the drain electrode. As illustrated in FIG. 17D, the recessed portion 220 is formed by removing the part of the oxide semiconductor layer 210 and the part of the island-shaped oxide semiconductor layer 211, whereby the conductive layer 216a and the conductive layer 216b can be electrically insulated from each other without fault. In addition, the conductive layer 218 functions as a wiring which electrically connects transistors and the like.

As the above etching, dry etching is preferably employed. By employing dry etching, a wiring structure or the like can be miniaturized as compared to the case of using wet etching. In addition, by employing dry etching, etching is performed with high controllability; therefore, the removal of the part of the island-shaped oxide semiconductor layer 210 (the formation of the recessed portion 220) can be performed with high controllability. As the gas which can be used for the dry etching, a chlorine-based gas such as chlorine ($Cl_2$), boron chloride ($BCl_3$), silicon chloride ($SiCl_4$), or carbon tetrachloride ($CCl_4$); a fluorine-based gas such as carbon tetrafluoride ($CF_4$), sulfur fluoride ($SF_6$), nitrogen fluoride ($NF_3$), or trifluoromethane ($CHF_3$); hydrogen bromide (HBr); oxygen ($O_2$); any of these gases to which a noble gas such as helium (He), or argon (Ar) is added; or the like can be used. Of course, wet etching may be used as the above etching.

In addition, as a material for the conductive layer 212, a material whose etching rate is higher than that of the island-shaped oxide semiconductor layer 210 or the island-shaped oxide semiconductor layer 211 is preferably used. This is because when the conductive layer 212, the island-shaped oxide semiconductor layer 210, and the island-shaped oxide semiconductor layer 211 are etched at one time, the etching rates of the island-shaped oxide semiconductor layer 210 and the island-shaped oxide semiconductor layer 211 are made smaller than that of the conductive layer 212, so that the island-shaped oxide semiconductor layer 210 can be prevented from being etched excessively.

Note that the resist mask 214a, the resist mask 214b, and the resist mask 214c are removed after the above etching.

After that, heat treatment is performed at a given temperature (for example, 350° C. to 800° C. (preferably 500° C. to 750° C.)). Note that in the case where a glass substrate is used as the substrate 200 having an insulating surface, it is necessary to perform heat treatment at a temperature lower than or equal to the strain point of the glass substrate. The heat treatment may be performed in an air atmosphere or a nitrogen atmosphere. By the heat treatment, crystal grains of an oxide semiconductor are grown in the island-shaped oxide semiconductor layer 210. Thus, an oxide semiconductor layer including crystal grains represented by $InGaO_3(ZnO)_m$ (m=1) in an amorphous structure represented by $InGaO_3(ZnO)_m$ (m>0) (an In—Ga—Zn—O based semiconductor layer) can be obtained.

An oxide semiconductor with an amorphous structure easily becomes an oxide semiconductor with a crystal structure due to heat or the like. Therefore, in the case where the proportion of the amorphous structure is high, a transistor tends to reduce its reliability. From the viewpoint of increasing the reliability, the heat treatment is performed so that the proportion of the amorphous structure is 90 volume % or less (preferably 80 volume % or less, more preferably 60 volume % or less).

Although heat treatment time can be changed in relation with heat treatment temperature as appropriate, for example, the heat treatment time can be approximately 0.5 hour to 2 hours at a temperature of 700° C. Further, since a temperature suitable for the heat treatment depends on the composition of an intended oxide semiconductor, there is no particular limitation on the heat treatment temperature as long as a desired oxide semiconductor layer can be obtained.

Note that, for the above heat treatment, a diffusion furnace, a heating furnace such as a resistance heating furnace, a rapid thermal annealing (RTA) apparatus, a microwave heating apparatus, or the like can be used. The irradiation with light having a wavelength which is absorbed by an oxide semiconductor (an electromagnetic wave) may be performed instead of the heat treatment. That is, the structure including crystal grains in an amorphous structure may be realized by irradiation with light (an electromagnetic wave). In this case, a laser capable of oscillating light having a short wavelength, an ultraviolet lamp, or the like may be used as a light source.

As described above, an oxide semiconductor layer including crystal grains represented by $InGaO_3(ZnO)_m$ (m=1) in an amorphous structure represented by $InGaO_3(ZnO)_m$ (m>0) is used for a channel formation region of a transistor, whereby a high-performance semiconductor device can be provided.

Here, in order to realize an oxide semiconductor layer with good electrical characteristics, a Zn content (atomic %) in an oxide semiconductor is preferably set lower than an In content (atomic %) and lower than a Ga content (atomic %), for example. With such a composition, an oxide semiconductor layer with good electrical characteristics can be obtained.

Note that an oxide semiconductor layer with a Zn content (atomic %) lower than an In content (atomic %) and lower than a Ga content (atomic %) as described above can be formed by a sputtering method using a target with a composition close to an intended composition. In this case, considering FIGS. 2 and 3, a decreasing proportion of Zn in a formed oxide semiconductor layer as compared to the proportion of Zn in a composition of the target is larger than those of In and Ga. Therefore, a target with a Zn content (atomic %) equal to an In or Ga content (atomic %) may be used in order to form an oxide semiconductor layer with a Zn content (atomic %) lower than an In or Ga content (atomic %), for example. That is, a target with a Zn content (atomic %) lower than or equal to an In or Ga content (atomic %) may be used.

Here, in this embodiment, an example of the case where the heat treatment is performed after the island-shaped semiconductor layer 210 is formed is given. However, there is no particular limitation on the timing of performing the heat treatment as long as the heat treatment is performed after the island-shaped semiconductor layer 206 is formed. Further, the heat treatment is not needed if a structure including a plurality of crystal grains in an amorphous structure (a structure in which a plurality of crystal grains are dispersed in an amorphous structure) is obtained at the stage of film formation.

Note that the recessed portion 220 of the exposed part of the island-shaped oxide semiconductor layer 210 may be subjected to oxygen radical treatment. By performing the oxygen radical treatment, the thin film transistor in which the island-shaped oxide semiconductor layer 210 is a channel formation region can be easily normally off. Further, by performing radical treatment, damage to the island-shaped oxide semiconductor layer 210 due to etching can be repaired. The radical treatment is preferably performed under an $O_2$ atmosphere; an $N_2O$ atmosphere; an $N_2$, He, or Ar atmosphere including oxygen; or the like. In addition, radical treatment may be performed under an atmosphere in which $Cl_2$ and/or $CF_4$ is added to the above atmosphere. Note that radical treatment is preferably performed without application of a bias voltage on the substrate 200 side.

Figure 17E:
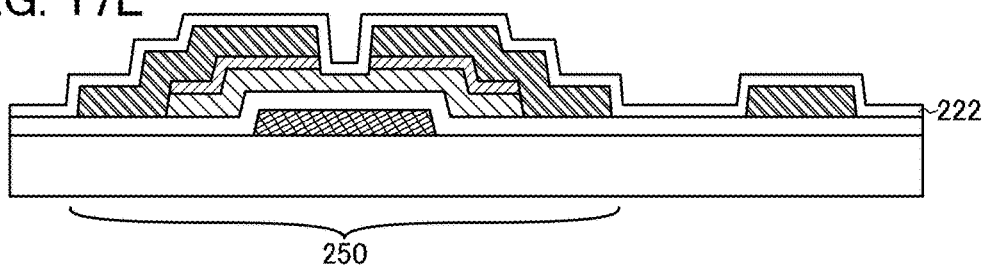

Next, a protective insulating layer 222 is formed so as to cover the thin film transistor 250 including the gate electrode 202, the island-shaped oxide semiconductor layer 210, the semiconductor region 215a with high conductivity, the semiconductor region 215b with high conductivity, the conductive layer 216a, the conductive layer 216b, and the like (see FIG. 17E). The protective insulating layer 222 may be formed by a sputtering method or the like using a material including silicon nitride, silicon oxide, silicon nitride oxide, silicon oxynitride, aluminum oxide, tantalum oxide, or the like.

After that, various kinds of electrodes and wirings are formed. Thus, the semiconductor device is completed.

According to this embodiment, a high-performance semiconductor device can be provided. Note that this embodiment can be implemented in combination with any of other embodiments as appropriate.

This application is based on Japanese Patent Application serial no. 2008-296901 filed with Japan Patent Office on Nov. 20, 2008, the entire contents of which are hereby incorporated by reference.

What is claimed is:

1. A semiconductor device comprising:
    an oxide semiconductor layer comprising a channel formation region,
    wherein the oxide semiconductor layer comprises crystals represented by $InGaZnO_4$,
    wherein the oxide semiconductor layer comprises In, Ga, and Zn,
    wherein a Zn content by atomic percent in the oxide semiconductor layer is less than an In content by atomic percent in the oxide semiconductor layer,
    wherein the Zn content by atomic percent in the oxide semiconductor layer is less than a Ga content by atomic percent in the oxide semiconductor layer, and
    wherein in the oxide semiconductor layer, a proportion of the crystals represented by $InGaZnO_4$ to a whole of crystals is 80 volume % or more.

2. The semiconductor device according to claim 1, wherein the oxide semiconductor layer is formed over and in contact with an insulating layer.

3. The semiconductor device according to claim 2, wherein the insulating layer comprises at least one film selected from a silicon oxide film, a silicon oxynitride film, a silicon nitride film, and a silicon nitride oxide film.

4. The semiconductor device according to claim 1, wherein the oxide semiconductor layer is formed using a target of In:Ga:Zn=2:2:1 by sputtering method.

5. The semiconductor device according to claim 1, wherein the semiconductor device is a transistor, and wherein an on/off ratio of the transistor is $10^9$ or higher and mobility of the semiconductor device is 10 $cm^2$/Vs or higher at a gate voltage of ±20 V.

6. A semiconductor device comprising:
    a first oxide semiconductor layer comprising a channel formation region; and
    a second oxide semiconductor layer over the first oxide semiconductor layer,
    wherein the first oxide semiconductor layer comprises crystals represented by $InGaZnO_4$,
    wherein the first oxide semiconductor layer comprises In, Ga, and Zn,
    wherein a Zn content by atomic percent in the first oxide semiconductor layer is less than an In content by atomic percent in the first oxide semiconductor layer,
    wherein the Zn content by atomic percent in the first oxide semiconductor layer is less than a Ga content by atomic percent in the first oxide semiconductor layer, and
    wherein a proportion of the crystals represented by $InGaZnO_4$ to a whole of crystals is 80 volume % or more in the first oxide semiconductor layer.

7. The semiconductor device according to claim 6, wherein a conductivity of the first oxide semiconductor layer is different from a conductivity of the second oxide semiconductor layer.

8. The semiconductor device according to claim 7, wherein the first oxide semiconductor layer is formed over and in contact with an insulating layer.

9. The semiconductor device according to claim 8, wherein the insulating layer comprises at least one film selected from a silicon oxide film, a silicon oxynitride film, a silicon nitride film, and a silicon nitride oxide film.

10. The semiconductor device according to claim 6, wherein the first oxide semiconductor layer is formed using a target of In:Ga:Zn=2:2:1 by sputtering method.

11. The semiconductor device according to claim 6, wherein the semiconductor device is a transistor, and wherein an on/off ratio of the transistor is $10^9$ or higher and mobility of the semiconductor device is 10 $cm^2$/Vs or higher at a gate voltage of ±20 V.

* * * * *